United States Patent
Park et al.

(10) Patent No.: US 7,673,209 B2
(45) Date of Patent: Mar. 2, 2010

(54) TEST PATTERN GENERATING CIRCUIT AND SEMICONDUCTOR MEMORY DEVICE HAVING THE SAME

(75) Inventors: Hwan-wook Park, Seongnam-si (KR); Young-uk Chang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 280 days.

(21) Appl. No.: 11/832,093

(22) Filed: Aug. 1, 2007

(65) Prior Publication Data
US 2008/0086663 A1 Apr. 10, 2008

(30) Foreign Application Priority Data
Oct. 10, 2006  (KR) ................. 10-2006-0098644

(51) Int. Cl.
  *G06F 11/00* (2006.01)
(52) U.S. Cl. ........................................ 714/738
(58) Field of Classification Search ................ 714/718, 714/726, 738
  See application file for complete search history.

(56) References Cited

U.S. PATENT DOCUMENTS

| | | | |
|---|---|---|---|
| 6,643,807 B1 * | 11/2003 | Heaslip et al. ............ | 714/719 |
| 6,718,487 B1 | 4/2004 | Sommer | |
| 6,904,375 B1 | 6/2005 | Sabih et al. | |
| 6,934,899 B2 | 8/2005 | Yuan et al. | |
| 6,959,257 B1 | 10/2005 | Larky et al. | |
| 7,134,061 B2 * | 11/2006 | Agashe et al. ............. | 714/726 |
| 7,155,648 B2 * | 12/2006 | Jas et al. .................... | 714/726 |
| 7,194,670 B2 * | 3/2007 | Fales et al. ................. | 714/733 |
| 7,228,478 B2 * | 6/2007 | Swaminathan ............. | 714/738 |
| 7,237,162 B1 * | 6/2007 | Wohl et al. ................. | 714/726 |
| 7,254,762 B2 * | 8/2007 | Anzou et al. ............... | 714/733 |
| 7,555,688 B2 * | 6/2009 | Alvamani et al. .......... | 714/729 |

FOREIGN PATENT DOCUMENTS

KR  1020040045447 A  6/2004

* cited by examiner

*Primary Examiner*—James C Kerveros
(74) *Attorney, Agent, or Firm*—Volentine & Whitt, PLLC

(57) ABSTRACT

Provided are a test pattern generating circuit which generates test patterns having various types and lengths and a semiconductor memory device which performs a test operation using the test pattern generating circuit. The test pattern generating circuit includes a plurality of register blocks which receive test signals input from an external tester through an input/output pad and load the test signals into the resister blocks in synchronization with a low-frequency clock signal; a register block control unit which controls the activation of the register blocks; and an output unit which is connected to the register blocks and outputs the signals loaded into the register blocks as test patterns in synchronization with a high-frequency clock signal.

25 Claims, 7 Drawing Sheets

FIG. 1 (PRIOR ART)

| Tester Cycle | DQ Cycle | DQ pin | | | | | | | |
|---|---|---|---|---|---|---|---|---|---|
| | | 7 | 6 | 5 | 4 | 3 | 2 | 1 | 0 |
| 0 | 0 | 0 | 0 | 0 | 1 | 1 | 1 | 1 | 0 |
| 0 | 1 | 0 | 0 | 1 | 1 | 1 | 1 | 0 | 0 |
| 0 | 2 | 0 | 1 | 1 | 1 | 1 | 0 | 0 | 0 |
| 0 | 3 | 1 | 1 | 1 | 1 | 0 | 0 | 0 | 0 |
| 1 | 4 | 1 | 1 | 1 | 0 | 0 | 0 | 0 | 1 |
| 1 | 5 | 1 | 1 | 0 | 0 | 0 | 0 | 1 | 1 |
| 1 | 6 | 1 | 0 | 0 | 0 | 0 | 1 | 1 | 1 |
| 1 | 7 | 0 | 0 | 0 | 0 | 1 | 1 | 1 | 1 |
| 2 | 8 | 0 | 0 | 0 | 1 | 1 | 1 | 1 | 0 |

200MHz data & 800MHz Shifting by DQ

FIG. 2 (PRIOR ART)

| 200MHz (2bit) loading | | 800MHz alternating data (8bit) unloading | | | | | | | | | | | | | | | |
|---|---|---|---|---|---|---|---|---|---|---|---|---|---|---|---|---|---|
| | | 7 | | 6 | | 5 | | 4 | | 3 | | 2 | | 1 | | 0 | |
| Early | Late | Early | Late | Early | Late | Early | Late | Early | Late | Early | Late | Early | Late | Early | Late |
| 0 | 1 | 0 | 1 | 0 | 1 | 0 | 1 | 0 | 1 | 0 | 1 | 0 | 1 | 0 | 1 |
| 1 | 0 | 1 | 0 | 1 | 0 | 1 | 0 | 1 | 0 | 1 | 0 | 1 | 0 | 1 | 0 |
| 0 | 0 | 0 | 0 | 0 | 0 | 0 | 0 | 0 | 0 | 0 | 0 | 0 | 0 | 0 | 0 |
| 1 | 1 | 1 | 1 | 1 | 1 | 1 | 1 | 1 | 1 | 1 | 1 | 1 | 1 | 1 | 1 |

TEST PATTERN GENERATING CIRCUIT AND SEMICONDUCTOR MEMORY DEVICE HAVING THE SAME

CROSS-REFERENCE TO RELATED PATENT APPLICATION

This application claims the benefit of Korean Patent Application No. 10-2006-0098644, filed on Oct. 10, 2006, the subject matter of which is hereby incorporated by reference.

BACKGROUND OF THE INVENTION

1. Field of the Invention

The present invention relates to a test pattern generating circuit and a semiconductor memory device incorporating same. More particularly, the invention relates to a test pattern generating circuit providing a variety of test patterns facilitating more precise testing and a semiconductor memory device incorporating same.

2. Description of the Related Art

As the operating speed of semiconductor memory devices increases generally, the frequency of system clocks operating within such devices also increases. Further data processing techniques designed to transmit a greater number of data bits per unit time at a defined clock frequency are also becoming more commonly used in semiconductor memory devices. These techniques include, as examples, double data rate (DDR), quad data rate (QDR) and octal data rate (ODR) approaches to data processing. Unfortunately, it is now common for test equipment used to check the operation of semiconductor memory devices following fabrication to actually run at a slower speed than the data transmission speed of the devices. As a result, the practical capabilities of conventional test equipment relative to contemporary high-speed semiconductor memory devices is rather restricted.

One complicating factor in the testing of high-speed semiconductor memory devices using relatively low-speed test equipment is the fact that actual data transmission is faster than the frequency of system clock within these devices. That is, test equipment must provide test patterns to a semiconductor memory device being tested at a rate 2 to 8 times (or even 16 times) faster than the device system clock due to the use of such techniques as DDR, QDR and ODR. Much of the available test equipment is simply unable to provide test patterns at this rate.

Examples of test patterns being generated for a high-speed semiconductor memory device using conventional low-speed test equipment will now be described with reference to the attached drawings.

Figures (FIGS.) 1 and 2 are tables showing examples of test patterns generated by conventional test equipment. FIG. 1 shows an example when the test equipment runs at a clock speed of 200 megahertz (MHz), but data input/output speeds for a semiconductor memory device being tested is 800 MHz.

The test patterns provided to a memory array of the semiconductor memory device are generated using an externally provided test signal. For example, a first test pattern having 2 bits per clock cycle of the 200 MHz system clock is input, and a second test pattern having 8 bits per clock cycle of the operation clock is generated in response to the first test signal.

The generated test pattern is loaded into a register and transmitted through an input/output pin of the semiconductor memory device. For example, the test pattern '00001111' is transmitted to the memory array through input/output pin DQ0. Then, the test pattern is shifted by one bit, and the test pattern '10000111' is transmitted to the memory array through input/output pin DQ1. Similarly, the test pattern '00011110' is transmitted to the memory array through input/output pin DQ7.

FIG. 2 is a table showing another example of test patterns generated by conventional test equipment. Referring to FIG. 2, a test signal having 2 bits per cycle of the 200 MHz operation clock is provided, and an 8-bit test pattern is generated in response to the test signal. For example, if a 2-bit test pattern is formed of 'Early=0'/'Late=1', an 8-bit pattern '01010101' is formed by repeating the 2-bit pattern, and the generated test pattern is transmitted to the memory unit. Similarly, if the 2-bit test pattern is formed of 'Early=1'/'Late=1', an 8-bit pattern '11111111' is formed.

In view of the foregoing exemplary accommodations, precise testing can not be performed due to the small range of possible test patterns capable of being transmitted to the memory array. All possible test patterns generated by the conventional test equipment correspond to test signals having a fixed identical pattern length. Such a range of possible test patterns is insufficient to fully test contemporary and emerging semiconductor memory devices.

SUMMARY OF THE INVENTION

Embodiments of the invention provide a test pattern generating circuit generating test patterns of varying type and length, and a semiconductor memory device capable of performing test operations using the test pattern generating circuit.

In one embodiment, the invention provides a test pattern generating circuit adapted for incorporation within a semiconductor memory device, the test pattern generating circuit comprising; a plurality of register blocks receiving test signals applied from an external tester through an input/output pad, and loading the test signals into the register blocks in synchronization with a relatively low-frequency external clock signal, a register block control unit controlling activation of the register blocks, and an output unit connected to the register blocks and outputting test patterns corresponding to the test signals loaded into the register blocks in synchronization with a relatively high-frequency internal clock signal.

In another embodiment, the invention provides a semiconductor memory device comprising; a memory unit, an input buffer receiving signals applied through an input/output pad and communicating signals to the memory unit, an output buffer transmitting signals provided from the memory unit to an external device through the input/output pad, and a test pattern generating circuit receiving test signals from an external tester, loading the test signals in synchronization with a relatively low-frequency external clock signal, and unloading the loaded signals as test patterns in synchronization with a relatively high-frequency internal clock signal in a test mode.

In another embodiment, the invention provides a test method for a semiconductor memory device, the method comprising; receiving test signals from an external tester in synchronization with a relatively low-frequency external clock signal, loading the test signals into a plurality of register blocks, unloading the loaded test signals from the register blocks as test patterns to a memory unit in synchronization with a relatively high-frequency internal clock signal, reading data from the memory unit, and determining whether the semiconductor memory device operates normally by comparing the read data with the test patterns.

BRIEF DESCRIPTION OF THE DRAWINGS

Embodiments of the invention will be described with reference to the attached drawings in which:

FIG. 1 is a table showing an example of test patterns generated by a conventional test device;

FIG. 2 is a table showing another example of test patterns generated by a conventional test device;

DESCRIPTION OF EMBODIMENTS

Figure 3:
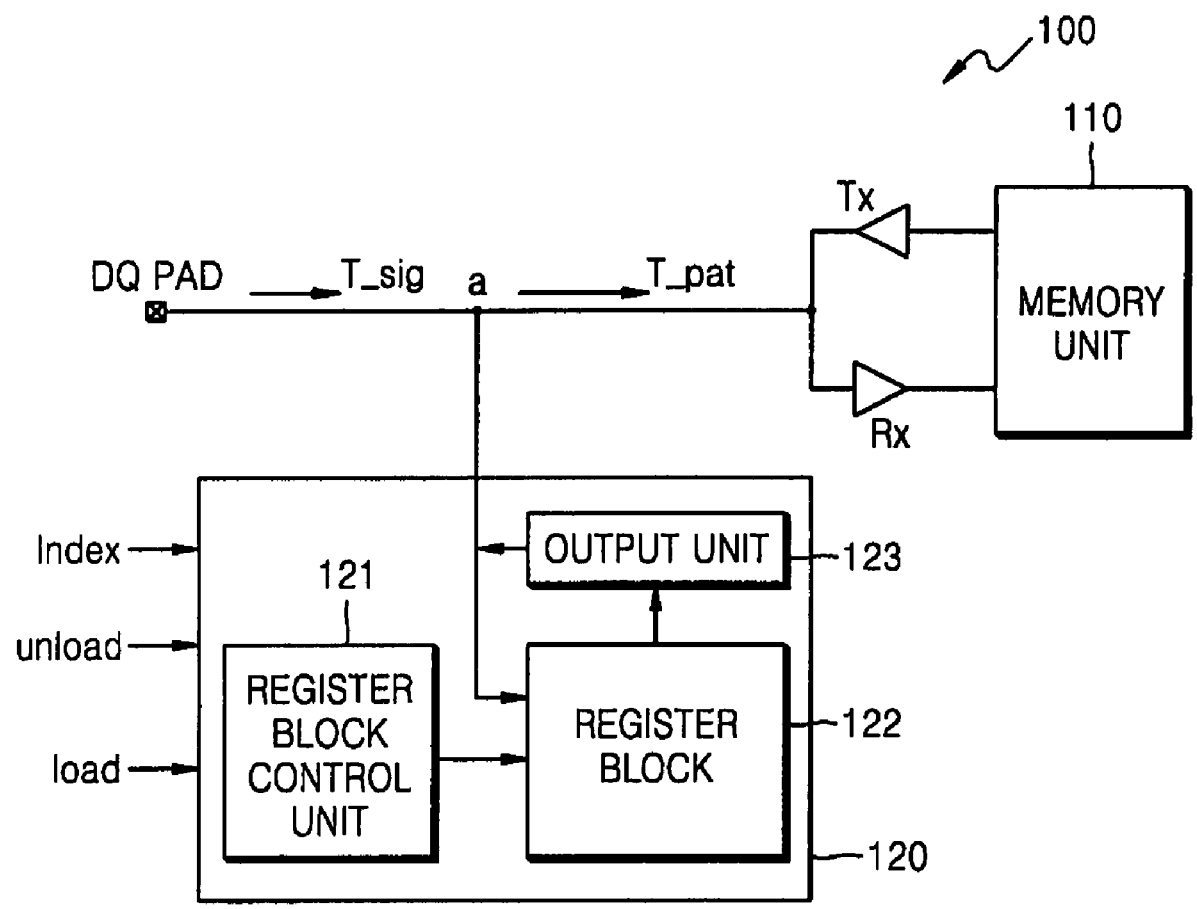
FIG. 3 is a block diagram of a semiconductor memory device according to an embodiment of the present invention.

Hereinafter, the present invention will be described in detail by explaining embodiments of the invention with reference to the attached drawings. Like reference numerals denote like elements in the drawings.

FIG. 3 is a block diagram of a semiconductor memory device according to an embodiment of the invention. Referring to FIG. 3, a semiconductor memory device 100 includes a memory unit 110 and a test pattern generating circuit 120. Semiconductor memory device 100 also includes an input buffer Rx receiving signals from an input/output pad DQ PAD, and an output buffer Tx transmitting signals received from memory unit 110.

Test pattern generating circuit 120 is connected to a node "a" located between the input/output pad DQ PAD and the input buffer Rx, and may be realized as a built-in self-test (BIST) circuit associated with memory unit 110. The BIST circuit is an embedded self-test device allowing self-testing within semiconductor memory device 100. Test data may be asserted by the BIST circuit in order to test memory unit 110. The BIST circuit determines whether the embedded memory performs memory operations normally or not by comparing an output value of the embedded memory with a reference data value.

In the illustrated embodiment, test pattern generating circuit 120 includes a register block control unit 121, a register block 122 and an output unit 123. Index signals (Index) activate one of a plurality of resister blocks provided in test pattern generating circuit 120. Control signals LOAD and UNLOAD are also provided to test pattern generating circuit 120. In its operation, test pattern generating circuit 120 loads test signals provided from an external device, or unloads test signals as test patterns to memory unit 110 in accordance with the control signals LOAD and UNLOAD.

Operation of semiconductor memory device 100 in a test mode will now be described in some additional detail.

In test mode, semiconductor memory device 100 is connected with an external tester (not shown), and test signals (T_sig) are applied from the tester to semiconductor memory device 100. The test signals T_sig are transmitted through the input/output pad DQ PAD and are provided to test pattern generating circuit 120 at node "a". In the illustrated embodiment, node "a" is located between the input/output pad DQ PAD and the input buffer Rx/output buffer Tx.

A clock signal is also applied to semiconductor memory device 100 from the tester through a predetermined clock input pad (not shown). The externally provided clock signal has a lower frequency than an internal clock signal controlling data input/output of semiconductor memory device 100. When provided with the test signals T_sig, test pattern generating circuit 120 loads the test signals T_sig into register block 122 in synchronization with a low-frequency clock signal. The control signal LOAD is activated while the test signals T_sig are loaded into register block 122. The control signals LOAD and UNLOAD are illustrated in FIG. 3, but it is possible that only one of the two control signals may be asserted at any given point in time.

As contemplated in the illustrated embodiment, register block 122 includes a plurality of register blocks. Each register block includes a plurality of shift registers connected in series. The test signals T_sig may be loaded into the shift registers of activated register blocks on a bit by bit basis. Since the test signals T_sig are loaded into the shift registers in synchronization with the low-frequency clock signal, the loading operation is necessarily performed at a relatively low speed.

Register block control unit 121 outputs a control signal which activates one of the plurality of register blocks corresponding to the input index signal INDEX. For example, if register block 122 includes 2n register blocks, n-bit index signals INDEX are input and 2n decoded control signals are output. Thus, under this assumption, register block control unit 121 includes a n-to-2n decoder (not shown) which decodes the index signals INDEX.

According to the above-described operation, the test signals T_sig are loaded into register block 122, and then output unit 123 unloads the signals of register block 122 as test patterns (T_pat) in synchronization with the high-frequency clock signal controlling memory array operations. The unloaded test patterns T_pat are provided to memory unit 110 through the input buffer Rx. The high-frequency clock signal will hereafter be termed the "internal clock signal" and the relatively low-frequency received from the external device is termed the "external clock signal."

The internal clock signal will define the data input/output speed of semiconductor memory device 100, and may be generated within semiconductor memory device 100 using the external clock or another externally applied clock signal. Since the test patterns T_pat are provided to memory unit 110 in synchronization with the internal clock signal, the test patterns T_pat can be provided to memory unit 110 at a speed corresponding to the expected data input/output speed of memory unit 110.

Output unit 123 may include a plurality of output elements respectively connected to the register blocks. For example, an output element connected to a first register block unloads signals from the first register block as the test patterns T_pat when the first register block is activated. An output element connected to a second register block unloads signals from the second register block as the test patterns T_pat when the second register block is activated, etc.

One of the register blocks is activated in accordance with the index signals INDEX set arbitrarily by a user, and signals loaded into the activated register block are unloaded as test patterns T_pat. The test patterns T_pat unloaded to memory unit 110 can be varied by the user setting bitstreams of the index signals INDEX.

TABLE 1

| Index | 0 | 1 | 2 | 3 |
|-------|---|---|---|---|
| 00 | 0 | 1 | 0 | 1 |
| 01 | 1 | 0 | 0 | 1 |
| 10 | 1 | 1 | 0 | 0 |
| 11 | 0 | 0 | 1 | 1 |

Referring to Table 1 above, if register block 122 includes 4 register blocks, 2-bit index signals INDEX may be used. In accordance with the index signals INDEX, one of the 4 register blocks is activated.

When the test signals T_sig are loaded, a first resister block is activated in accordance with index signal INDEX 00, and test signal T_sig 0101 is loaded into the first register block, and a second resister block is activated in accordance with index signal INDEX 01, and test signal T_sig 1001 is loaded into the second register block, etc.

When the test patterns T_pat are unloaded, various combinations of index signals INDEX are enabled such that various types of test patterns T_pat can be provided to memory unit 110. For example, if 8-bit test patterns T_pat are used, 16 combinations of the index signals INDEX can be generated. Accordingly, 16 types of test patterns T_pat can also be generated.

The test patterns T_pat are loaded into memory unit 110, and the operation of memory unit 110 can be checked by reading stored test patterns T_pat and comparing the read test patterns T_pat with the originally provided test patterns. The test result may be transmitted back to the external tester through the output buffer Tx and the input/output pad DQ PAD.

An exemplary configuration for test pattern generating circuit 120 will be described in some additional detail with reference to FIG. 4.

Figure 4:
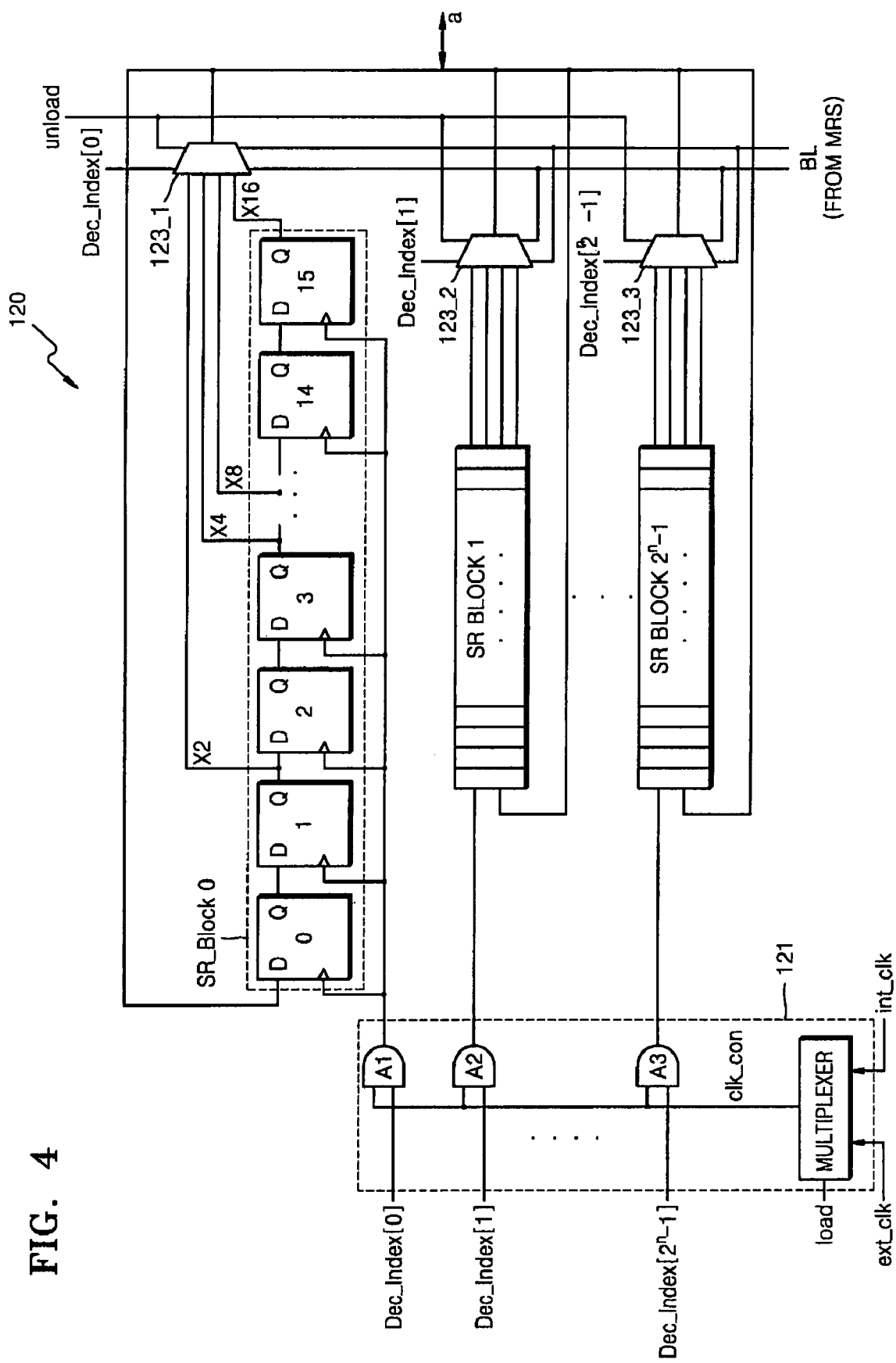
FIG. 4 is a circuit diagram of a test pattern generating circuit according to an embodiment of the present invention.

Referring to FIG. 4, test pattern generating circuit 120 includes register block control unit 121. According to one embodiment of the invention, register block control unit 121 may include AND gates A1 through A3 respectively connected to the register blocks, and a multiplexer.

The n-bit index signals INDEX are decoded into a plurality of block selection signals DEC_INDEX [0] through DEC_INDEX [$2n-1$]. The block selection signals DEC_INDEX [0] through DEC_INDEX [$2n-1$] are respectively applied to a plurality of input terminals of the AND gates A1 through A3 respectively connected to the register blocks. The multiplexer is controlled by a predetermined control signal LOAD. The external clock signal EXT_CLK and the internal clock signal INT_CLK are input to the multiplexer, and the multiplexer outputs a control clock signal CLK_CON. Control clock signal CLK_CON is applied to one of the input terminals of the AND gates A1 through A3.

When one of the block selection signals DEC_INDEX [0] through DEC_INDEX [$2n-1$] is activated, the AND gate to which the block selection signal corresponds provides a clock signal to a clock terminal of a shift register included in the corresponding register block. The shift register loads or unloads signals bit by bit in synchronization with the applied clock.

If the test signals T_sig provided from the external tester are loaded, the multiplexer is controlled by the control signal LOAD and outputs the external clock signal EXT_CLK. If the signals loaded into the register block are unloaded as the test patterns T_pat, the multiplexer is controlled by the control signal LOAD and outputs the internal clock signal INT_CLK. Accordingly, the test signals T_sig are input from the low-speed external tester and then the test patterns T_pat are provided to memory unit 110 in accordance with a data input/output speed expected by high-speed semiconductor memory device 100.

In the illustrated embodiment, register block 122 includes a plurality of register blocks SR_Block 0 through SR_Block $2n-1$. Each of the register blocks SR_Block 0 through SR_Block $2n-1$ includes a plurality of shift registers. For example, each of the register blocks SR_Block 0 through SR_Block $2n-1$ may include 16 shift registers connected in series.

The register blocks SR_Block 0 through SR_Block $2n-1$ are connected to output unit 123. Output unit 123 in the illustrated embodiment includes a plurality of output elements 123_1 through 123_3 respectively connected to each of the register blocks SR_Block 0 through SR_Block $2n-1$. A first output element 123_1 is connected to a first register block SR_Block 0, a second output element 123_2 is connected to a second register block SR_Block 1, etc., thereby forming a feedback structure. Accordingly, when the test patterns T_pat are unloaded, they are also fed back and loaded into the first shift registers.

The output elements 123_1 through 123_3 may be multiplexers as illustrated in FIG. 4. For example, first output element 123_1 may be a 4 to 1 multiplexer. An output terminal of a second shift register included in the first register block SR_Block 0 is input to an input terminal of the 4 to 1 multiplexer. An output terminal of a fourth shift register, an output terminal of a eighth shift register, and an output terminal of a sixteenth shift register are input to the input terminals of the 4 to 1 multiplexer.

According with the foregoing structural assumptions, the number of bits of the test patterns T_pat unloaded corresponding to one of the index signals INDEX can be controlled. That is, the burst length of signals unloaded corresponding to the index signals INDEX is variable. A control signal BL sets the burst length. A mode register set (MRS) signal can be used for the control signal BL.

For example, if first output element 123_1 unloads signals provided from the output terminal of the fourth shift register by the control signal BL, a 4-bit test pattern T_pat is unloaded corresponding to one index signal INDEX. The output test pattern is fed back and is loaded into the first through fourth shift registers bit by bit.

The block selection signals DEC_INDEX [0] through DEC_INDEX [$2n-1$] and the control signal UNLOAD are input to each of output elements 123_1 through 123_3 in order to control same. Output elements 123_1 through 123_3 unload the test patterns T_pat from the register blocks SR_Block 0 through SR_Block $2n-1$ in response to the control signal LOAD. Accordingly, if the control signal UNLOAD is activated, output elements 123_1 through 123_3 output one of 4 input signals.

Here, one of the block selection signals DEC_INDEX [0] through DEC_INDEX [$2n-1$] is activated and the others are left inactivated. One of the output elements 123_1 through 123_3 is enabled in accordance with the input index signals INDEX and the test patterns T_pat is unloaded from the corresponding register block. For example, if the burst length is set to 4 bits and 8-bit test patterns T_pat need to be provided to memory unit 110, the test patterns T_pat loaded into two of 2n register blocks may be combined. As a result, various types of the test patterns T_pat can be generated and provided to memory unit 110.

Figure 5:
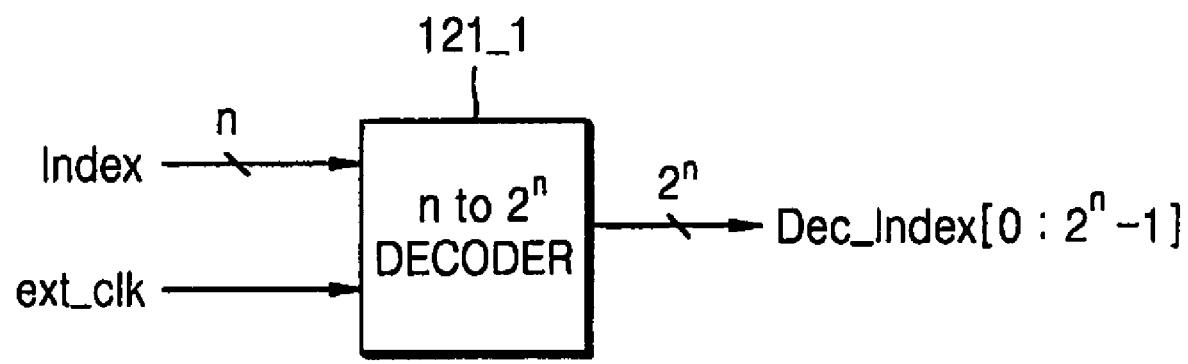
FIG. 5 is a block diagram of a decoder which decodes index signals included in the test pattern generating circuit of FIG. 3 according to an embodiment of the present invention.

FIG. 5 is a block diagram of a "n to 2n decoder" 121_1 which decodes index signals INDEX according to an embodiment of the invention.

N-bit index signals INDEX and a clock signal are input to an input terminal of the n to 2n decoder 121_1. In the illustrated embodiment, the clock signal is the external clock signal EXT_CLK. The n to 2n decoder 121_1 decodes the index signals INDEX in synchronization with the external clock signal EXT_CLK and generates block selection signals DEC_INDEX [0: 2n−1].

The operation of semiconductor memory device 100 incorporating the above-described circuits and running in test mode will be described with reference to FIGS. 6 and 7.

Figure 6:
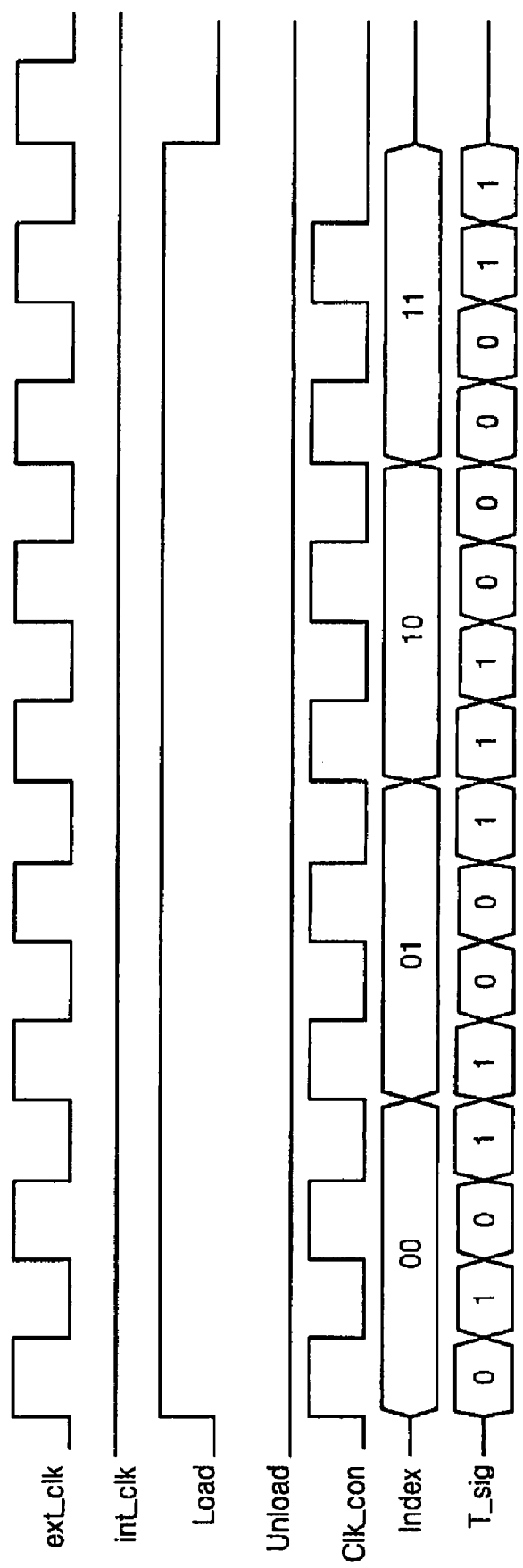
FIG. 6 shows waveforms of a loading operation of test signals in the test pattern generating circuit of FIG. 3, according to an embodiment of the present invention.

FIG. 6 shows waveforms of a loading operation of the test signals T_sig in test pattern generating circuit 120 of FIG. 3, when the burst length is set to 4 bits and semiconductor memory device 100 is using a QDR data input/output technique. The index signals INDEX are 2-bit signals and 4 register blocks are included.

Referring to FIG. 6, when the test signals T_sig are loaded, the control signal LOAD is activated. Since the control signal LOAD is activated, the multiplexer of register block control unit 121 provides the external clock signal EXT_CLK to AND gates A1 through A3 as the control clock signals CLK_CON.

As shown in Table 1, if the index signal INDEX is assumed to be "00", the first register block is activated and data "0101" is loaded into the first-fourth shift registers bit by bit. Likewise, if the index signal INDEX is "01", the second register block is activated and data "1001" is loaded bit by bit, etc.

When the above-described loading operation of the test signals T_sig is completed, signals loaded into the register blocks are unloaded as the test patterns T_pat.

Figure 7:
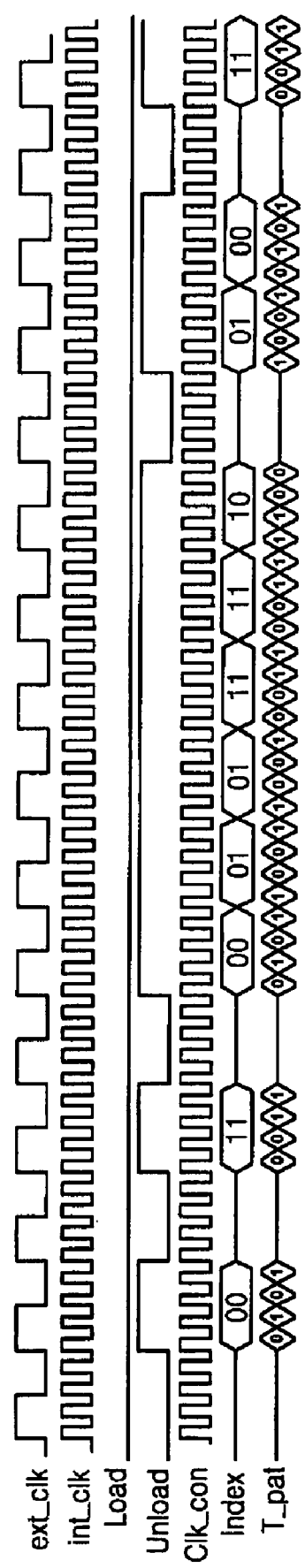
FIG. 7 shows waveforms of an unloading operation of test signals in the test pattern generating circuit of FIG. 3, according to an embodiment of the present invention.

FIG. 7 shows waveforms of an unloading operation of the test patterns T_pat in test pattern generating circuit 120 of FIG. 3. Referring to FIG. 7, when the test signals T_sig are unloaded, the control signal UNLOAD is activated. Since the control signal UNLOAD is activated, the multiplexer of register block control unit 121 provides the internal clock signal INT_CLK to AND gates A1 through A3 as the control clock signal CLK_CON.

A QDR semiconductor memory device inputs/outputs 4 bits of data per cycle of the external clock signals EXT_CLK. The internal clock signal INT_CLK generated in semiconductor memory device 100 has a frequency 4 times greater than the external clock signal EXT_CLK. The test signals T_sig are unloaded from the register blocks to memory unit 110 in synchronization with the internal clock signal INT_CLK.

As illustrated in FIG. 7, if the index signal INDEX is "00", the first register block is activated and data "0101" is unloaded from the first register block to memory unit 110 in synchronization with the internal clock signal INT_CLK. If the index signal INDEX is "11", data "0011" is unloaded from the first register block to the memory unit 110 in synchronization with the internal clock signal INT_CLK. Since the shift registers of each register block form a feedback structure, the unloaded test patterns T_pat are loaded bit by bit again into the respective shift registers.

Figure 8:
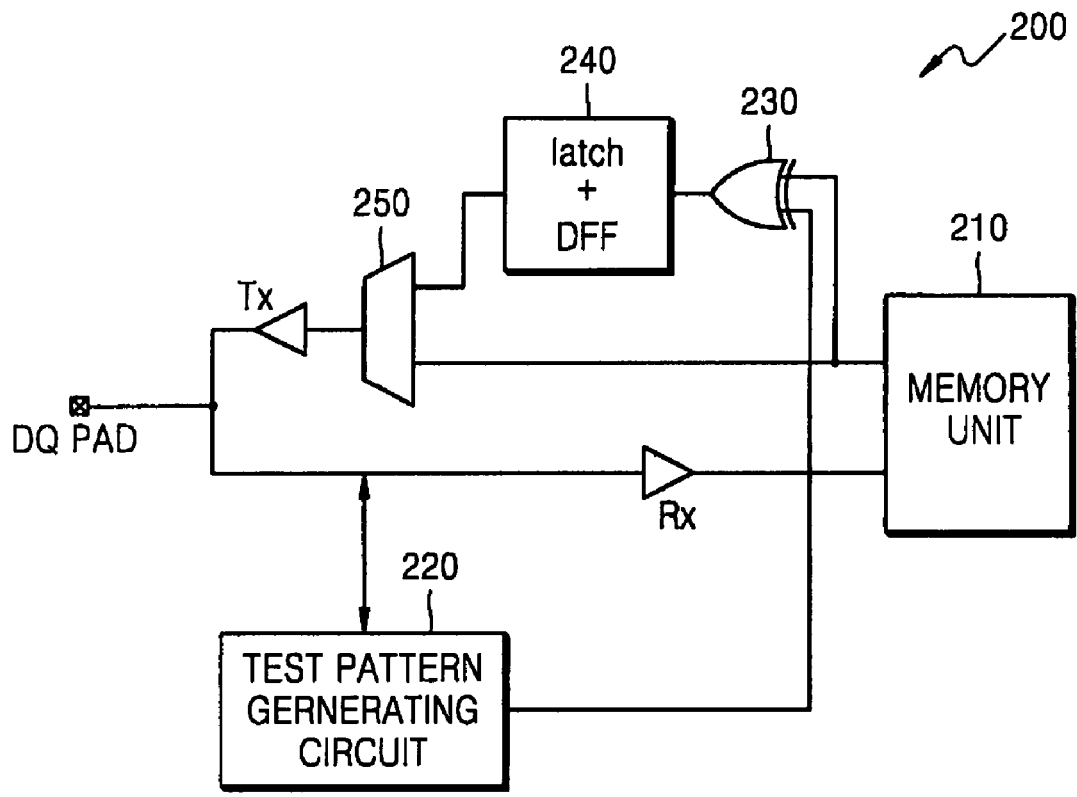
FIG. 8 is a block diagram of a semiconductor memory device according to another embodiment of the present invention.

FIG. 8 is a block diagram of a semiconductor memory device 200 according to another embodiment of the invention, and comprises a test pattern generating circuit 220 used for storage of expected data.

Referring to FIG. 8, semiconductor memory device 200 include a memory unit 210, test pattern generating circuit 220, a logic element 230, and an error signal generator 240. In the illustrated embodiment, error signal generator 240 includes a latch and a D flip-flop circuit (DFF). Other components of semiconductor memory device 200 have already been described in the foregoing context, and will not be described again.

If test signals are applied through an input/output pad DQ PAD from an external tester, test pattern generating circuit 220 loads the test signals in synchronization with an external clock signal. Then, the loaded signals are transmitted to an input buffer Rx as test patterns in synchronization with an internal clock signal. The input buffer Rx unloads the test patterns to memory unit 210.

When these loading and unloading operations of the test signals are completed, the test patterns are read from memory unit 210 and provided to an input terminal of logic element 230. An exclusive OR gate may be used for logic element 230.

The test patterns are input to an input terminal of logic element 230 from test pattern generating circuit 220. Logic element 230 compares the two types of input data and outputs a signal according to the comparison result. The test patterns input from test pattern generating circuit 220 are the "expected data". The signals read from memory unit 210 should be the same as the expected data. That is, if the two types of input data are identical, the operation of memory unit 210 is determined to be normal. If the two types of input data are not identical, the operation of memory unit 210 is determined to be faulty.

The signal output from logic element 230 is transmitted to error signal generator 240. If the two types of input signals are not identical, logic element 230 provides a high-level signal and the latch included in error signal generator 240 latches the signal provided from logic element 230. The D flip-flop included in error signal generator 240 outputs the latched signal.

To determine whether semiconductor memory device 200 operates normally, an error signal to be applied to the external tester should be provided synchronous with the external clock signal. Accordingly, the external clock signal may be used to gate the D flip-flop and the signal input from the latch can be output in synchronization with the external clock signal.

Figure 9:
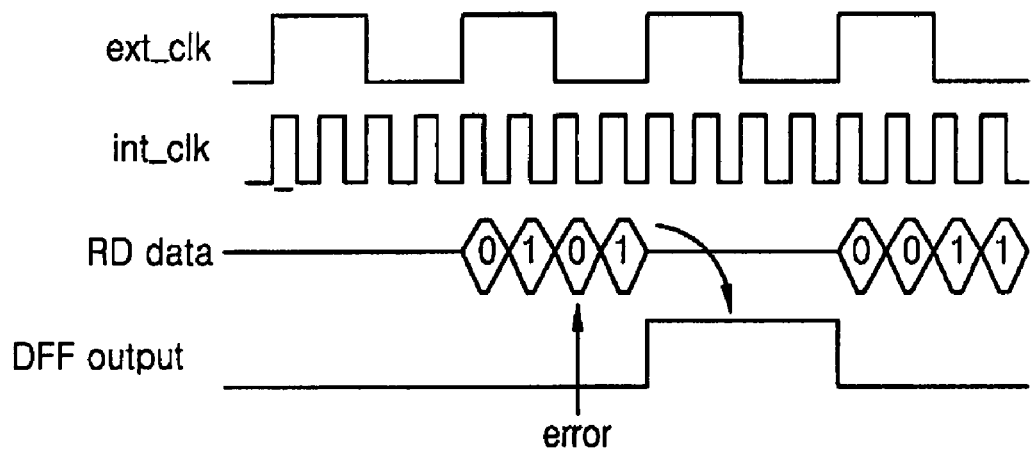
FIG. 9 shows waveforms of an operation example of the semiconductor memory device of FIG. 8, according to an embodiment of the present invention.

FIG. 9 shows waveforms of an error signal DFF output which is generated at low speed when an error occurs in RD data read from memory unit 210, according to an embodiment of the present invention.

Semiconductor memory device 200 may further include a multiplexer 250 between an output buffer Tx and error signal generator 240. The RD data read from memory unit 210 and the output signal of error signal generator 240 are input to two input terminals of multiplexer 250. Control signals (not shown) corresponding to normal operation mode or test mode are applied to multiplexer 250. In normal mode for semiconductor memory device 200, multiplexer 250 transmits the RD data read from memory unit 210 to an external device through the output buffer Tx. In test mode for semiconductor memory device 200, multiplexer 250 the output signal of error signal generator 240 to the external device through the output buffer Tx.

As described above, a semiconductor memory device according to the present invention may generate high-speed test patterns having various shapes and lengths while being tested by a relatively low-speed tester. Therefore, post manufacture testing may continue to be performed with existing test equipment while ensuring accurate testing of semiconductor memory devices.

While the present invention has been particularly shown and described with reference to exemplary embodiments thereof, it will be understood by those skilled in the art that various changes in form and detail may be made therein without departing from the scope of the invention as defined by the appended claims. The exemplary embodiments should be considered in a descriptive sense only, and not for purposes of limitation. Therefore, the scope of the invention is defined not by the detailed description of the invention but by the appended claims, and all differences within the scope will be construed as being included in the present invention.

What is claimed is:

1. A test pattern generating circuit adapted for incorporation within a semiconductor memory device comprising a memory unit, the test pattern generating circuit comprising:
a plurality of register blocks receiving test signals applied from an external tester through an input/output pad, and loading the test signals into the resister blocks in synchronization with and an external clock signal during a loading operation;
a register block control unit selectively activating the register blocks in response to an index signal and storing the test signals in the selectively activated register blocks; and
an output unit connected to the register blocks and providing a test pattern generated by a combination of the test signals loaded into the register blocks,
wherein during an unloading operation, the register block control unit sequentially activates the register blocks in response to the index signal and the output unit provides the test pattern to the memory unit in synchronization with an internal clock signal having a frequency higher than the external clock signal.

2. The test pattern generating circuit of claim 1, wherein the external clock is provided by the external tester and the internal signal controls operation of the memory unit.

3. The test pattern generating circuit of claim 2, wherein the frequency of the internal clock signal defines an operating speed for the semiconductor memory device.

4. The test pattern generating circuit of claim 2, wherein the register block control unit comprises a plurality of logic elements connected to each of the register blocks.

5. The test pattern generating circuit of claim 4, wherein the register block control unit further comprises a multiplexer receiving the external clock signal and the internal clock signal through an input terminal and outputting one of the external clock signal and the internal clock signal to the logic elements.

6. The test pattern generating circuit of claim 5, wherein the multiplexer outputs the external clock signal while the test signals are loaded into the register blocks and outputs the internal clock signal while the signals loaded into the register blocks are unloaded.

7. The test pattern generating circuit of claim 6, wherein each of the logic elements has one input terminal receives an output signal of the multiplexer and another input terminal receives a block selection signal which activates one of the register blocks.

8. The test pattern generating circuit of claim 1, wherein each of the register blocks comprises a plurality of shift registers connected in series.

9. The test pattern generating circuit of claim 8, wherein one or more output terminals of the shift registers for each register block is connected to the output unit.

10. The test pattern generating circuit of claim 9, wherein each of the register blocks has a feedback structure, such that test patterns output from the output unit are applied to input terminals of the register blocks.

11. The test pattern generating circuit of claim 8, wherein the output unit comprises a plurality of multiplexers connected respectively to the register blocks.

12. The test pattern generating circuit of claim 11, wherein one or more output terminals of the shift registers of each register block are connected to input terminals of the multiplexers.

13. The test pattern generating circuit of claim 12, wherein each of the multiplexers outputs a signal provided from one output terminal among signals provided from one or more output terminals of the shift registers connected to the input terminals of the multiplexers corresponding to a burst length control signal.

14. The test pattern generating circuit of claim 13, wherein the burst length control signal is a mode register set (MRS) signal.

15. A semiconductor memory device comprising:
a memory unit;
an input buffer receiving signals applied through an input/output pad and communicating the signals to the memory unit;
an output buffer transmitting signals provided from the memory unit to an external device through the input/output pad; and
a test pattern generating circuit operative in a test mode of the semiconductor memory device and comprising:
a plurality of register blocks configured to load test signals provided from an external tester through the input/output pad in synchronization with an external clock signal,
a register block control unit configured to selectively activate the plurality of register blocks in response to an index signal during loading of the test signals, and
an output unit connected to the plurality of register blocks and configured to provide a test pattern to the memory unit formed by a combination of the test signals loaded into the plurality of register blocks in synchronization with an internal clock signal having a frequency higher than the external clock signal.

16. The semiconductor memory device of claim 15, wherein the test pattern generating circuit is electrically connected to the memory unit at a node between the input/output pad and the input buffer.

17. The semiconductor memory device of claim 15, wherein the external clock signal is provided from the external tester and the internal clock signal controls operation of the memory unit.

18. The semiconductor memory device of claim 17, wherein the frequency of the internal clock signal defines the operating speed of the semiconductor memory device.

19. The semiconductor memory device of claim 15, further comprising:
a comparison unit receiving and comparing a test result from the memory unit with the test pattern provided from the test pattern generating circuit; and
an error signal generator generating and providing an error signal in accordance with the comparison result.

20. The semiconductor memory device of claim 19, further comprising:
a multiplexer receiving the error signal and data from the memory unit, and providing the error signal during the test mode, and providing the data during a normal mode.

21. A test method for a semiconductor memory device comprising a memory unit, the method comprising:
receiving test signals from an external tester and loading the test signals into a plurality of register blocks in synchronization with an external clock signal; and thereafter, unloading the test signals loaded into the plurality of register blocks to provide a test pattern to the memory unit formed by a combination of the test signals in synchronization with an internal internal clock signal, wherein a frequency of the internal clock signal is higher than a frequency of the external clock signal.

22. The method of claim 21, wherein at least one of loading of the test signals into the plurality of register blocks and unloading of the test signals loaded into the plurality of register blocks to provide the test pattern is performed in response to an externally provided index signal.

23. The method of claim 22, wherein test signals loaded in the plurality of register blocks have a number of bits that varies in accordance with a burst length control signal.

24. The method of claim 21, further comprising:
reading data from the memory unit in the form of a test result; and
comparing the test result with the test pattern provided from the test pattern generating circuit to generate a comparison result.

25. The method of claim 24, further comprising:
generating an error signal in accordance with the comparison result;
providing the error signal to an external device in synchronization with the external clock signal to determining whether the semiconductor memory device is operating normally.

* * * * *